US007061338B2

(12) United States Patent
Arigliano

(10) Patent No.: US 7,061,338 B2
(45) Date of Patent: Jun. 13, 2006

(54) AVERAGE CONTROLLED (AC) RESONATOR DRIVER

(75) Inventor: Antonello Arigliano, Germering (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 60 days.

(21) Appl. No.: 10/957,290

(22) Filed: Oct. 1, 2004

(65) Prior Publication Data

US 2006/0061425 A1    Mar. 23, 2006

(30) Foreign Application Priority Data

Sep. 21, 2004   (EP) ................................. 04392037

(51) Int. Cl.
*H03L 5/00* (2006.01)
*H03B 5/30* (2006.01)
*H03B 5/36* (2006.01)
(52) U.S. Cl. ................................ 331/109; 331/116 FE; 331/154; 331/158; 331/183
(58) Field of Classification Search ............ 331/108 R, 331/109, 116 R, 116 FE, 117 R, 117 FE, 331/117 D, 154, 156, 182, 183
See application file for complete search history.

(56) References Cited

U.S. PATENT DOCUMENTS

| 4,470,024 A | 9/1984 | Leuenberger ........... 331/108 D |
| 4,853,655 A * | 8/1989 | Embree et al. ........ 331/116 FE |
| 5,606,295 A | 2/1997 | Ohara et al. ........... 331/116 FE |
| 5,621,361 A | 4/1997 | Adduci ......................... 331/75 |
| 6,028,491 A | 2/2000 | Stanchak et al. ............. 331/75 |
| 6,278,338 B1 | 8/2001 | Jansson ................ 331/116 FE |

FOREIGN PATENT DOCUMENTS

| EP | 1143605 A | 10/2001 |
| JP | 07202570 | 8/1995 |
| JP | 07297641 | 11/1995 |

OTHER PUBLICATIONS

"High-Performance Crystal Oscillator Circuits: Theory and Application", by Vittoz et al., IEEE Jrnl. of Solid-State Circuits, vol. 23, No. 3, Jun. 1988, pp. 774-783.
"MOS Crystal Oscillator Design", by Meyer et al., IEEE Jrnl. of Solid-State Circuits, vol. SC-15, No. 2, Apr. 1980, pp. 222-228.

* cited by examiner

*Primary Examiner*—David Mis
(74) *Attorney, Agent, or Firm*—Saile Ackerman LLC; Stephen B. Ackerman

(57) ABSTRACT

Circuits and methods are given, to realize and implement an oscillator circuit with an Average Controlled (AC) Resonator Driver. A newly introduced additional Field Effect Transistor within a voltage average stabilizing regulation loop controlling the crystal oscillator's amplifier element produces an average voltage value stabilized sinusoidal oscillation signal which is then transformed into a square wave with a precise duty-cycle of exactly 50%. Said circuits and methods are designed in order to be implemented with a very economic number of components, capable to be realized with modern integrated circuit technologies.

38 Claims, 15 Drawing Sheets

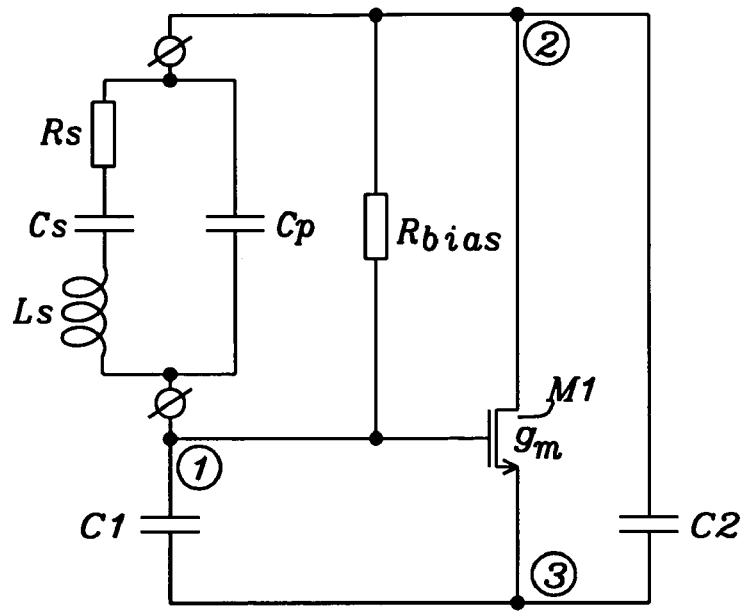
FIG. 1A – Prior Art
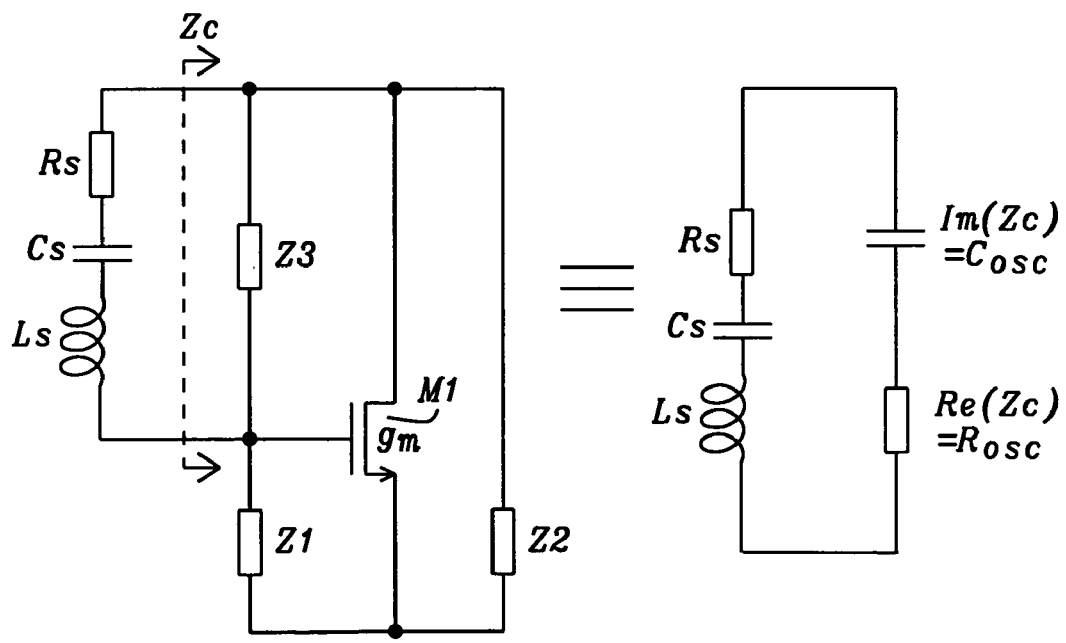
FIG. 1B – Prior Art

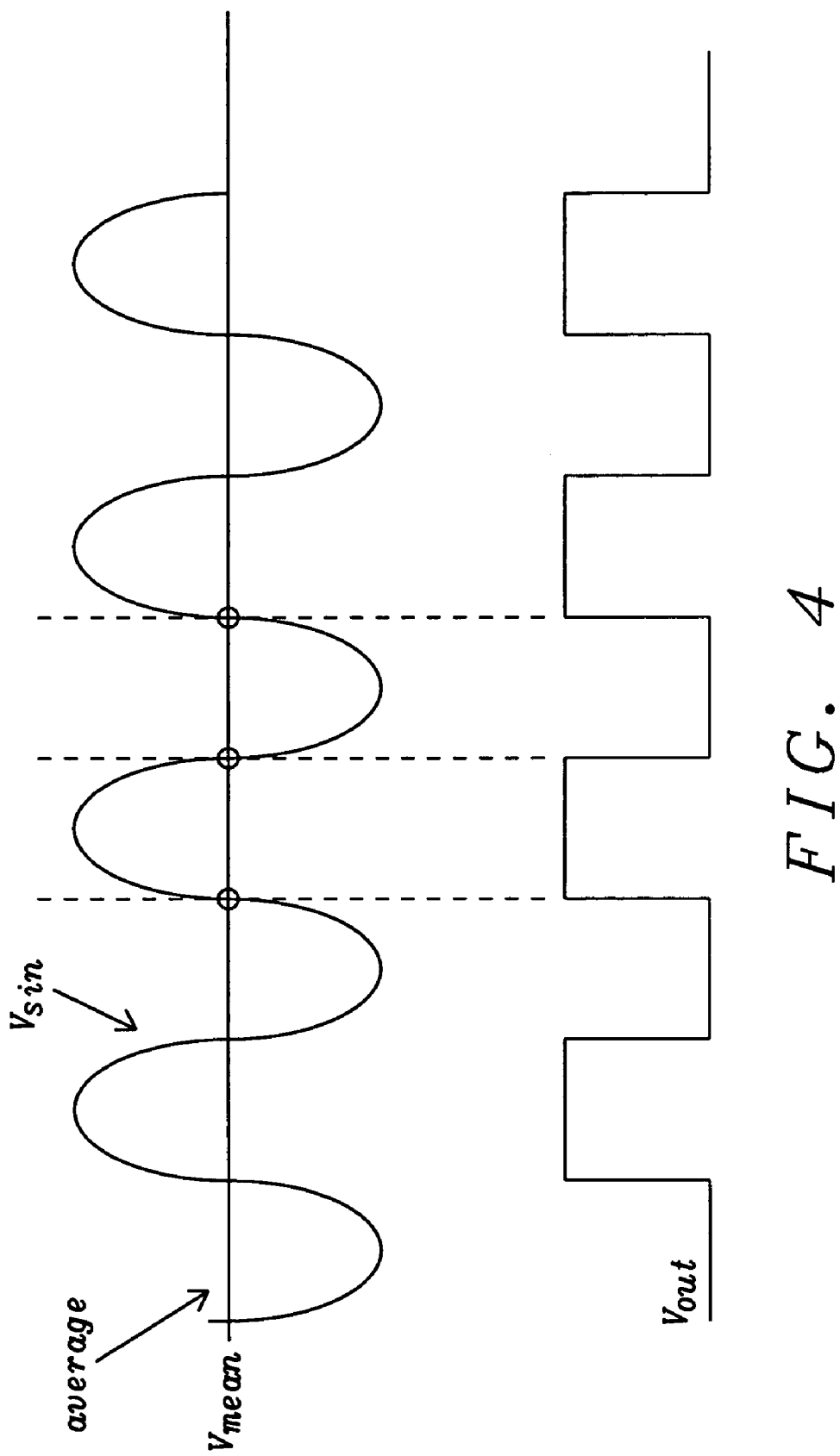

*Provide an oscillation generating circuit for an implementation of an Average Controlled (AC) Resonator Driver oscillator circuit in form of a basic three-point oscillator configuration, having three nodes (1, 2 and 3) and containing a resonator two-pole located between said first node 1 and said second node 2 as well as further passive and active components* —701

*Provide a terminal for supply voltage connection as well as a terminal for ground connection, which is tied to said third node 3* —702

*Provide said passive components for said basic three-point oscillator circuit in form of two capacitors and one resistor embedding said resonator two-pole between said two capacitors, all arranged in PI-configuration, bridging said resonator with said resistor and in such a way, that capacitor one is tied with its first pole to said first node 1 and capacitor two, also with its first pole, tied to said second node 2* —703

*Provide further as passive components two resistors connected in series, forming a resistive voltage divider and tied on one divider side to said supply voltage terminal and on the other divider side to said ground terminal, establishing an intermediate node for a reference voltage* —704

*Provide as active components an operational amplifier with differential inputs, inverting and non-inverting, and amplifier output as well as a Schmitt Trigger or a comparator circuit with signal and reference inputs and circuit output and also a supply current source feeding into said second node 2* —705

730 — Operate said AC Resonator Driver oscillator circuit as a basic three-point oscillator with said first FET as oscillation inducing and sustaining active component for signal amplifying additionally enhanced with said second FET for oscillation signal voltage averaging controlled by said amplifier output signal from said operational amplifier

↓

735 — Control said averaging operation within said AC Resonator Driver oscillator circuit by regulating said oscillation signal voltage at said first node 1 of said three-point oscillator against said reference voltage at said intermediate node of said resistive voltage divider in such a way, that the difference of these voltages applied to said differential inputs of said operational amplifier generates an amplifier output signal fed to said second FET for oscillation signal voltage averaging is kept as small as possible, thus effectively stabilizing the voltage average of said oscillator signal to said reference voltage

↓

740 — Start generating continuous oscillations, consisting of alternating half-waves of oscillation cycles by operating said AC Resonator Driver oscillator circuit with said resonator-current flowing through said resonator element fed in by said supply current source and also through said oscillation inducing and sustaining first FET as well as through said second FET for oscillation signal voltage averaging, controlled by said averaging operation

↓

750 — Generate a square wave output signal with a precise duty-cycle of 50% out of said alternating half-waves of oscillation cycles of said oscillation signal voltage by feeding said Schmitt Trigger or comparator with said oscillation signal voltage and therein comparing against said reference voltage at said intermediate node of said resistive voltage divider thus delivering square wave pulses with alternating polarity exactly synchronized with said alternating half-waves of oscillation cycles of said voltage averaged oscillation signal

*FIG. 5C*

```
┌─────────────────────────────────────────────┐
│ Provide an oscillation generating circuit   │
│   for an implementation of an Average       │
│   Controlled (AC) Resonator Driver          │
│   oscillator circuit in form of a           │
│   basic three-point oscillator              │
│   configuration, having three nodes         │──701
│   (1, 2 and 3) and containing a             │
│   resonator two-pole located between said   │
│   first node 1 and said second node 2 as    │
│   well as further passive and active        │
│   components                                │
└─────────────────────────────────────────────┘
                    ↓
┌─────────────────────────────────────────────┐
│ Provide a terminal for supply voltage       │
│   connection as well as a terminal for      │──702
│   ground connection, which is tied to       │
│   said third node 3                         │
└─────────────────────────────────────────────┘
                    ↓
┌─────────────────────────────────────────────┐
│ Provide said passive components for said    │
│   basic three-point oscillator circuit      │
│   in form of two capacitors and one         │
│   resistor embedding said resonator         │
│   two-pole between said two capacitors,     │──703
│   all arranged in PI-configuration,         │
│   bridging said resonator with said         │
│   resistor and in such a way, that          │
│   capacitor one is tied with its first      │
│   pole to said first node 1 and             │
│   capacitor two, also with its first        │
│   pole, tied to said second node 2          │
└─────────────────────────────────────────────┘
                    ↓
┌─────────────────────────────────────────────┐
│ Provide further as passive components       │
│   two resistors connected in series,        │
│   forming a resistive voltage divider       │
│   and tied on one divider side to said      │──704
│   supply voltage terminal and on the        │
│   other divider side to said ground         │
│   terminal, establishing an intermediate    │
│   node for a reference voltage              │
└─────────────────────────────────────────────┘
                    ↓
┌─────────────────────────────────────────────┐
│ Provide as active components an             │
│   operational amplifier with differential   │
│   inputs, inverting and non-inverting,      │
│   and amplifier output as well as a         │
│   Schmitt Trigger or a comparator circuit   │──705
│   with signal and reference inputs and      │
│   circuit output and also a supply          │
│   current source feeding into said          │
│   second node 2                             │
└─────────────────────────────────────────────┘
                    ↓
```

730 — Operate said AC Resonator Driver oscillator circuit as a basic three-point oscillator with said first FET as oscillation inducing and sustaining active component for signal amplifying additionally enhanced with said second FET for oscillation signal voltage averaging controlled by said amplifier output signal from said operational amplifier

735 — Control said averaging operation within said AC Resonator Driver oscillator circuit by regulating said oscillation signal voltage at said first node 1 of said three-point oscillator against said reference voltage at said intermediate node of said resistive voltage divider in such a way, that the difference of these voltages applied to said differential inputs of said operational amplifier generates an amplifier output signal fed to said second FET for oscillation signal voltage averaging is kept as small as possible, thus effectively stabilizing the voltage average of said oscillator signal to said reference voltage

740 — Start generating continuous oscillations, consisting of alternating half-waves of oscillation cycles by operating said AC Resonator Driver oscillator circuit with said resonator-current flowing through said resonator element fed in by said supply current source and also through said oscillation inducing and sustaining first FET as well as through said second FET for oscillation signal voltage averaging, controlled by said averaging operation

750 — Generate a square wave output signal with a precise duty-cycle of 50% out of said alternating half-waves of oscillation cycles of said oscillation signal voltage by feeding said Schmitt Trigger or comparator with said oscillation signal voltage and therein comparing against said reference voltage at said intermediate node of said resistive voltage divider thus delivering square wave pulses with alternating polarity exactly synchronized with said alternating half-waves of oscillation cycles of said voltage averaged oscillation signal

*FIG. 6C*

AVERAGE CONTROLLED (AC) RESONATOR DRIVER

BACKGROUND OF THE INVENTION (1) Field of the Invention

The present invention relates generally to electronic oscillators usable as clock generators and in particular to improved crystal resonator oscillators, thin-film resonator or micro electromechanical resonator oscillators, realized with monolithic integrated-circuit technologies, where one chip solutions include automatic amplitude control and biasing to accommodate a highly accurate frequency-generation exhibiting low phase noise and stable amplitudes up to higher frequencies.

(2) Description of the Prior Art

Crystal oscillators in monolithic integrated circuit technology are developed using Pierce oscillator or three-point oscillator circuit schemes, where the frequency determining resonator is working in a resonance mode, where the equivalent reactance is inductive. Realized with quartz crystals as resonators normally phase noise is considered sufficiently good at frequency offsets not too far away from the oscillator carrier signal. It would be advantageous to extend the operating range whilst maintaining a good phase noise behavior at farer away offsets.

Crystal-controlled oscillators have been in use for decades in electronic systems as frequency references; but such oscillators have mostly been implemented using bi-polar transistors as active elements. However, the dominant technology for the fabrication of most integrated circuits today is CMOS and design techniques for highly stable crystal oscillators in this technology are less well known, especially when it comes to frequencies of about 100 MHz, as necessary for modern communication applications.

In the prior art, there are different technical approaches for achieving the goals of good tuneability over wider ranges and low phase noise. These crystal oscillator arrangements always include a piezo-electric, e.g. quartz, crystal and drive current means therefore. Unfortunately, these approaches are somewhat expensive, both in terms of technical complexity (e.g. differential push-pull or balanced bridge structures, extra filter or tank circuits, sophisticated temperature compensation or gain control circuits, amplitude peak detectors etc.) and—hence—commercial costs. It would be advantageous to reduce both expenses. This is achieved by using an oscillator circuit working with a crystal in inductive resonance mode, as three-point oscillator derived from the Pierce oscillator. Using the intrinsic advantages of that solution—as described later on in every detail—the circuit of the invention is realized with standard CMOS technology at low cost.

Preferred prior art realizations are implementing such related crystal oscillator circuits in single chip or multiple chip solutions as integrated circuits. The large chip areas needed and consequently the high costs are the main disadvantages of these prior art solutions. It is therefore a challenge for the designer of such devices and circuits to achieve a high-quality but also low-cost solution.

Several prior art inventions referring to such solutions describe related methods, devices and circuits, and there are also several such solutions available with various patents referring to comparable approaches, out of which some are listed in the following:

U.S. Pat. No. 5,606,295 (to Ohara, et al.) describes crystal oscillator circuits, wherein a one pin on-chip crystal oscillator circuit and a method of operating that oscillator are provided. The oscillator makes use of the gate-source capacitance of a MOS transistor to provide capacitance which would otherwise need to be provided by one of two oscillator capacitors. The MOS transistor is provided with a floating well by coupling its body to its source, so that the gate-source capacitance does not change substantially when the transistor is turned off. In another aspect of the invention, the MOS transistor is provided with a floating well using a parallel combination of MOS transistor elements, so as to minimize the coupling resistance of the MOS transistor to other elements of the circuit. In another aspect of the invention, the MOS transistor is coupled to a simulated inductive circuit for assuring that the impedance of the two passive oscillator components, normally capacitors, is inductive (will not oscillate) at frequencies near the fundamental frequency of the crystal and capacitive (will oscillate) at frequencies near the third harmonic of the crystal. In another aspect of the invention, the MOS transistor is coupled to a circuit for setting its transconductance by reference to an external component.

U.S. Pat. No. 5,621,361 (to Adduci) discloses a one-pin integrated crystal oscillator, wherein said one-pin integrated crystal oscillator in a Colpitts configuration employs a differential amplifier, provided with a feedback network, as an input gain stage. This achieves an enhanced stability and independence from temperature variation, a high Q figure, and a short start-up with a relatively small area of integration.

U.S. Pat. No. 6,028,491 (to Stanchak et al.) shows a crystal oscillator with controlled duty-cycle wherein an oscillator circuit having a first node oscillating with a first indeterminate duty-cycle and having a second node oscillating with a predetermined second duty-cycle. Both nodes oscillate at similar frequencies. A variable current source and a switch are coupled in series between Vcc and ground with the output of the variable current source being the second node. The first node controls the switch, which is closed when the first node is at a first logic state and is opened when it is at a second logic state. During each cycle, a monitoring circuit measures the time span that the first node is at the first logic state and adjusts the magnitude of the variable current source to make it directly proportional to the measured time span. By adjusting the variable current source, the second node can be made to reach a desired voltage level in a desired amount of time during each cycle. In a second embodiment, a current limiting transistor is inserted between the second node and the switch. The current limiting transistor is controlled by the monitoring circuit and is made to reduce the influence of the switch on the second node as the duty-cycle of the first node approaches the predetermined second duty-cycle.

The related literature sees two relevant papers. In the paper from Robert G. Meyer et al.—cited here as [Meyer, R.G. Soo, D. C.-F. "MOS Crystal Oscillator Design," IEEE Journal of Solid-State Circuits, Vol. SC-15, No. 2, April 1980, pp. 222–228] first, describing the operation of MOS crystal oscillators as investigated assuming near-sinusoidal AC voltages at gate and drain, wherein is shown that the circuit operation depends basically on only two normalized parameters. Computer solutions are used to produce a series of normalized curves allowing oscillator design for prescribed start-up conditions, steady-state amplitude, and operating current. The theoretical predictions therein agree closely with measurements on sample circuits. The second paper from Eric A. Vittoz et al. cited here as [Vittoz, E. A. Degrauwe, M. G. R. & Bitz, S. "High-Performance Crystal Oscillator Circuits: Theory and Application," IEEE Journal of Solid State Circuits, Vol. SC-23, No. 3, June 1988, pp. 774–783] presents a general theory that allows the accurate linear and nonlinear analysis of any crystal oscillator circuit. It is based on the high Q of the resonator and on a very few nonlimiting assumptions. The special case of the three-point oscillator, that includes Pierce and one-pin circuits, is analyzed in more detail. A clear insight into the linear behavior, including the effect of losses, is obtained by means of the circular locus of the circuit impedance. A basic condition for oscillation and simple analytic expressions are derived in the lossless case for frequency pulling, critical transconductance, and start-up time constant. The effects of nonlinearities on amplitude and on frequency stability are analyzed. As an application, a 2-MHz CMOS oscillator which uses amplitude stabilization to minimize power consumption and to eliminate the effects of nonlinearities on frequency is described. The chip, implemented in a 3-μm p-well low-voltage process, includes a three-stage frequency divider and consumes 0.9 μA at 1.5 V. The measured frequency stability is 0.05 p.p.m./V in the range 1.1–5 V of supply voltage. Temperature effect on the circuit itself is less than 0.1 p.p.m. from −10 to +60° C.

The basic three-point oscillator circuit is shown in FIG. 1A prior art in form of a simplified circuit diagram (i.e. without power supply and ground connections) with one Field Effect Transistor (FET) M1 with conductance $g_m$ as the active i.e. amplifying component and named as such also as basic active component, connected at said three nodes (1, 2 & 3 shown encircled) to a resonator element (with its equivalence elements: resistance Rs, capacitance Cs and inductance Ls and a parasitic capacitance Cp); the FET being current-voltage biased by a resistive component $R_{bias}$ and all embedded within a capacitance PI-configuration, consisting of two capacitors C1 and C2. FIG. 1B prior art on the left side redraws this configuration somewhat more generally, now introducing three impedances Z1, Z2 and Z3 as substitution for Cp, $R_{bias}$ as well as C1 and C2 from FIG. 1A prior art, it shall be pointed out, that the resonator can now be understood as virtually terminated by a complex impedance Zc. On the right side an electrically equivalent circuit is given, with Rs, Cs and Ls from the resonator equivalence diagram and these virtual complex impedance Zc, represented by its real and imaginary parts Re(Zc)=$C_{osc}$ and Im(Zc)=$R_{osc}$. This virtual impedance Zc replaces the whole active driving part of the oscillator and by virtue of power matching, ruling that the impedance Zc has to be conjugated complex i.e. the resonator beeing essentially inductive we need an essentially capacitive impedance Zc, such as it is depicted in FIG. 1B prior art to the utmost right with a serial circuit of $R_{osc}$ and $C_{osc}$, therefore obligatory incorporating the effects of the load capacitors C1 and C2. Some further aspects for design and development of oscillator Integrated Circuits (IC) shall be noted here. Today's ICs are complete electronic systems often requiring a crystal oscillator to generate an accurate clock signal. Recent advances in technology allow for ever increasing clock frequencies. The standard configuration for clock generators is a Pierce oscillator that has the crystal and its load capacitors connected between two pins of the IC. With the trend to minimize the number of external components the load capacitors are sometimes integrated. In order to be able to trim the resonance frequency these load capacitors can then be implemented as capacitor banks switched by digital circuitry. In a Pierce oscillator both capacitors are referring to ground facilitating the use of MOS gate capacitances and thereby greatly reducing the chip area. Still due to the limited number of pins on an IC-package it is desirable to have the same function with a single pin and the crystal referring to ground. Several one pin oscillators have been reported, but they all need at least one floating capacitor. This leads to large chip area or expensive process options and difficulties with respect to tuning by means of switched capacitor banks. Most one pin oscillators are a variant of the three point oscillator of which the basic oscillator block is depicted in FIG. 1A prior art, wherein the crystal is represented as a series resonant branch Rs, Cs and Ls and said parasitic lead capacitor Cp. If node 1 (encircled) or 2 (encircled) is set to ground and the other nodes are properly biased the crystal can be externally grounded. This results in a one pin oscillator. Setting node 3 (encircled) to ground instead gives a Pierce oscillator. C1 and C2 are the load capacitors of which the series value should equal the crystals specific load capacitance to obtain the nominal crystal frequency. The importance of these oscillator circuits for modern IC-design is therefore clearly explained; for oscillators of the three-point, Pierce and one-pin type likewise.

Although these patents and papers describe circuits and/or methods close to the field of the invention they differ in essential features from the method, the system and especially the circuit introduced here.

SUMMARY OF THE INVENTION

A principal object of the present invention is to realize a circuit for generating voltage average stabilized oscillation signals in form of very manufacturable integrated circuits at low cost. The results are especially applicable and very efficient for use with resonators made up of Quartz or Piezo crystals, or of Thin-Film Resonators (TFR), or of Micro Electro Mechanical System (MEMS) resonators but not restricted to only those types of resonators.

Another principal object of the present invention is to provide an effective and very manufacturable method for generating voltage average stabilized oscillation signals.

Another further object of the present invention is to attain a precise square wave clock signal with a precise duty-cycle of exactly 50%.

Another further object of the present invention is to reduce the cost of manufacturing by implementing the circuit as a monolithic integrated circuit in low cost CMOS technology.

Also an object of the present invention is to lessen the dependence from resonator parameters and active components characteristics and at the same time to thereby reach a low-cost realization with modern integrated circuit technologies.

Another still further object of the present invention is to reduce cost by minimizing the chip area by means of effectively minimizing component values.

Further another object of the present invention is to give a method, whereby a sinus wave generation with controlled average value is established and thus a square wave clock signal can be achieved with a duty-cycle of 50% and being more stable over temperature and process variations.

In accordance with the objects of this invention, a new circuit is described, capable of realizing an oscillator circuit with an Average Controlled (AC) Resonator Driver and producing a square wave clock signal with a precise duty-cycle of exactly 50%, comprising oscillation generating means containing a resonator two-pole element as oscillation defining element delivering a sinus wave oscillation signal; amplifying means for inducing and sustaining said resonator two-pole controlled oscillations; power supplying means with supply voltage connection; means for a ground connection; voltage average controlling means for said amplifying means forming a voltage average controlled sinus wave oscillation signal; control voltage generating means for said voltage average controlling means; reference voltage producing means for said average voltage controlling means and said voltage comparing and triggering means; power supplying means with a supply voltage connection as well as means for a ground connection; and voltage comparing and triggering means for generating a square wave clock signal out of said voltage average controlled sinus wave oscillation signal arranged in such a way, that said voltage comparing and triggering means generates a square wave output signal with a precise duty-cycle of 50% out of said alternating half-waves of sinusoidal oscillation cycles of said sinus wave oscillation signal voltage by feeding said voltage comparing and triggering means with said sinus wave oscillation signal voltage and therein comparing against said reference voltage from said reference voltage producing means thus delivering square wave pulses triggered with alternating polarity and exactly synchronized with said alternating half-waves of sinus wave oscillation cycles of said voltage averaged sinus wave oscillation signal.

Also in accordance with the objects of this invention, a new method is described, capable of implementing an oscillation generating circuit as an Average Controlled (AC) Resonator Driver oscillator, producing a square wave clock signal with a precise duty-cycle of exactly 50%, comprising: providing oscillation generating means for an implementation of an Average Controlled (AC) Resonator Driver oscillator circuit containing a resonator two-pole element as oscillation defining element; providing amplifying means for inducing and sustaining said resonator two-pole controlled oscillation signal; providing voltage average controlling means for said amplifying means; providing control voltage generating means for said voltage average controlling means; providing voltage comparing and triggering means for generating a square wave signal out of said oscillation signal; providing reference voltage producing means for said average voltage controlling means and said voltage comparing and triggering means; providing power supplying means with a supply voltage connection as well as means for a ground connection; arranging said oscillation generating means together with said amplifying means energized by said power supplying means in such a manner allowing to produce said oscillation signal continuously; arranging said voltage average controlling means in connection with said control voltage generating means in association with said reference voltage producing means powered by said power supplying means in such a way that an appropriate voltage average of said continuously generated oscillation signal can be constituted; operating said AC Resonator Driver oscillator circuit activating said arranged amplifying means in connection with said arranged voltage average controlling means thus generating a voltage average controlled oscillation signal; controlling said voltage average controlled oscillation signal operation in such a way, that said arranged amplifying means in conjunction with said arranged voltage average controlling means controls said oscillation generating means with said resonator two-pole element in order to stabilize the voltage average of said oscillation signal to said reference voltage value set-up by said reference voltage producing means, thus effectively clamping the voltage average of said oscillator signal to said reference voltage; starting the generation of continuous oscillations, consisting of alternating half-waves of sinusoidal oscillation cycles by operating said AC Resonator Driver oscillator circuit with said voltage average controlling means, thus delivering said oscillation signal voltage as sinus wave with controlled voltage average; and generating a square wave output signal with a precise duty-cycle of 50% out of said alternating half-waves of sinusoidal oscillation cycles of said oscillation signal voltage by feeding said voltage comparing and triggering means with said sinus wave oscillation signal voltage and therein comparing against said reference voltage from said reference voltage producing means thus delivering square wave pulses triggered with alternating polarity and exactly synchronized with said alternating half-waves of oscillation cycles of said voltage averaged oscillation signal.

BRIEF DESCRIPTION OF THE DRAWINGS

In the accompanying drawings forming a material part of this description, the details of the invention are shown:

FIG. 1A prior art shows the basic three-point oscillator circuit in form of a simplified circuit diagram.

FIG. 1B prior art redraws this configuration somewhat more generally on the left side, and show its electrically equivalent circuit diagram on the right side.

FIG. 4 illustrates the internally generated sine wave signal in relation to the square wave signal of the clock output for the new oscillator circuit with said Average Controlled (AC) Resonator Driver as shown in FIG. 2.

DESCRIPTION OF THE PREFERRED EMBODIMENTS

The following preferred embodiments disclose a novel oscillator circuit with an Average Controlled (AC) Resonator Driver.

Figure 2A:
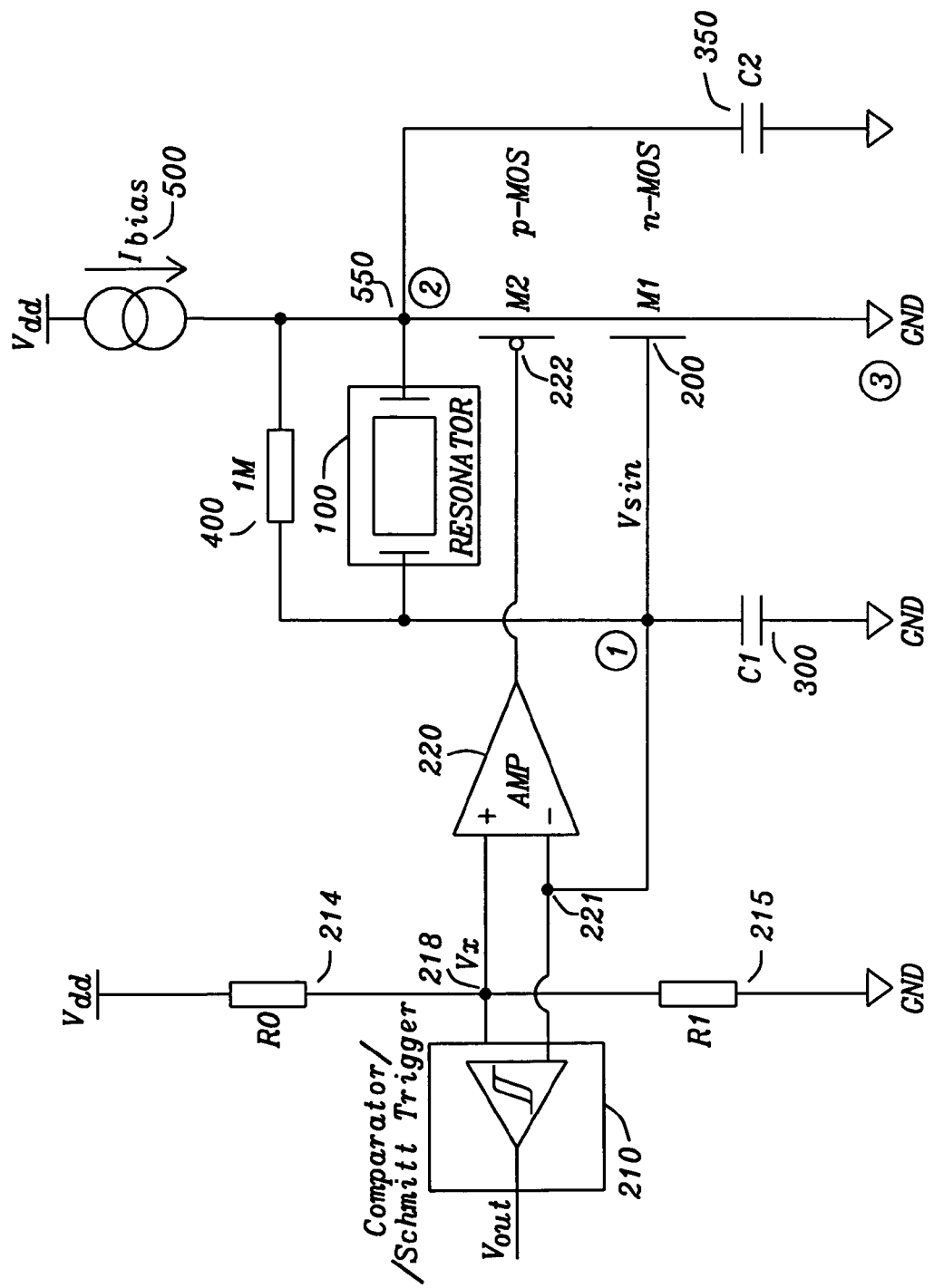
FIGS. 2A and 3A show electrical circuit diagrams for the new oscillator circuit with Average Controlled (AC) Resonator Driver for several different preferred embodiments of the present invention implementable with a variety of modern monolithic integrated circuit technologies.

Contemplating now FIG. 2A, a circuit diagram of the new oscillator circuit with an Average Controlled (AC) Resonator Driver is given in form of circuit schematics for a first embodiment. The essential components from the basic three-point oscillator circuit as shown in FIG. 1A prior art can be relocated: between the supply voltage $V_{dd}$ and ground (GND) a current source 500, named also as active supply component, delivering the bias-current $I_{bias}$ leads to a central connection point 550, node 2 (comparable to node 2 (encircled) in FIG. 1A prior art), from there said newly introduced FET M2 (item 222) is connected in series with FET M1 (item 200), which itself is wired to ground. The additional FET M2 (item 222) is named also as Average Controlling (AC) component and enhancing the prior art circuit to said new AC Resonator Driver oscillator circuit. The resonator element 100, shown here as a quartz crystal resonator is embedded between said two load capacitors C1 and C2 (items 300 and 350 respectively) and connected in such a way, that one pin of the two-pole resonator, node 1 (comparable to node 1 (encircled) in FIG. 1A prior art) is tied to capacitor C1 (item 300) and the other pin, node 2 (comparable to node 2 (encircled) in FIG. 1A prior art) is tied to said central connection point 550, together with capacitor C2 (item 350) and said Average Controlling (AC) component FET M2 (item 222) on its part serially connected to said FET M1 (item 200) as well. Said FET M1 (item 200) then leads on to ground node 3 (comparable to node 3 (encircled) in FIG. 1A prior art) with voltage GND. Another component of the circuit is a resistor 400 of approximately 1 MOhm e.g., which is bridging said resonator two-pole element in order to supply the drive current to the gate of said FET M1 (item 200), which is tied to the connection point node 1 (comparable to node 1 (encircled) in FIG. 1A prior art) of one resonator pin with capacitor C1 (item 300). The influence of this resistor on the bias-current behavior shall be neglected in the following. Considering now the operation of said AC Resonator Driver oscillator circuit in steady state, whereby the bias-current $I_{bias}$ from said current source 500 is flowing into the AC Resonator Driver circuit, essentially driving the resonator 100 but also flowing through FET M2 (item 222) via said second FET M1 (item 200) to ground, said FET M1 (item 200) conducting in one or the other direction, depending on the half-wave of the sinus oscillation cycle generated, it can be recognized, that the additional FET M2 (item 222) can be used for controlling the voltage average value $V_{mean}$ of the sine wave $V_{sin}$. This is made possible by trying to clamp the gate voltage of FET M1 (item 200) to a precisely fixed reference voltage of value $V_x$, derived with the help of a resistive voltage divider made up of resistors R0 (item 214) and R1 (item 215), connected between the supply voltage $V_{dd}$ and GND. The clamping is realized by an amplifier AMP (item 220) with two differentially floating inputs and with an ideally infinite input impedance for said two floating inputs, one non-inverting input (item 218) and one inverting input (item 221), thus amplifying the voltage difference of the input signals, namely non-inverting input 218 being tied to voltage $V_x$—as delivered from said voltage divider—and inverting input 221 being tied to $V_{sin}$—picked-up a node 1 of the three-point oscillator—in this case here resulting in an input voltage $V_x-V_{sin}$. Furtheron said amplifier AMP exhibits infinite gain and zero output impedance and is as such normally designated as operational amplifier. The output voltage is then fed to the gate of said Average Controlling (AC) FET M2 (item 222) and thus closing a regulator loop, set-up by said amplifier AMP (item 220) between voltage $V_{sin}$ at node 1 and the gate of FET M2 (item 222), regulating per conductance $g_m$—i.e. the gate voltage controlling the drain current—said voltage $V_{sin}$ at node 1. Assuming infinite gain of the amplifier AMP (item 220) a small voltage input $V_x-V_{sin}$ is amplified into a large output voltage, with the tendency established by using FET M2 (item 222) to decrease the input voltage $V_x-V_{sin}$ until it will become zero, which means signal voltage $V_{sin}$ is approaching $V_x$. The averaging is however reached through the dynamic behavior of the amplifier AMP (item 220), i.e. the frequency characteristics of the real operational amplifier, which are basically from the low-pass filter type, and while operating in a feedback loop defined by the real loop parameters, which then have to be specified by proper design. Recapitulating can be stated: the average value $V_{mean}$ of the sinus wave $V_{sin}$, generated at the gate of the FET M1 (item 200), is equal to $V_x$ and determined by the ratio of the resistors R0 (item 214) and R1 (item 215). This value $V_x$ depends only on the value of the supply voltage $V_{dd}$ and, if a perfect matching between R0 and R1 is assumed, will not change over temperature and with process variations. Feeding the sine wave voltage $V_{sin}$ into a Schmitt Trigger or a comparator device (item 210) with trigger level at $V_x$, an oscillator generated clock pulse $V_{out}$ with a duty-cycle of exactly 50% is reached. And this is possible because the transconductance $g_m$ of the FET M2 (item 222) is regulated by the amplifier AMP (item 220) and the FET M1 (item 200) in such a way, that the average of the sinus $V_{sin}$ is equal to $V_x$.

Figure 2B:
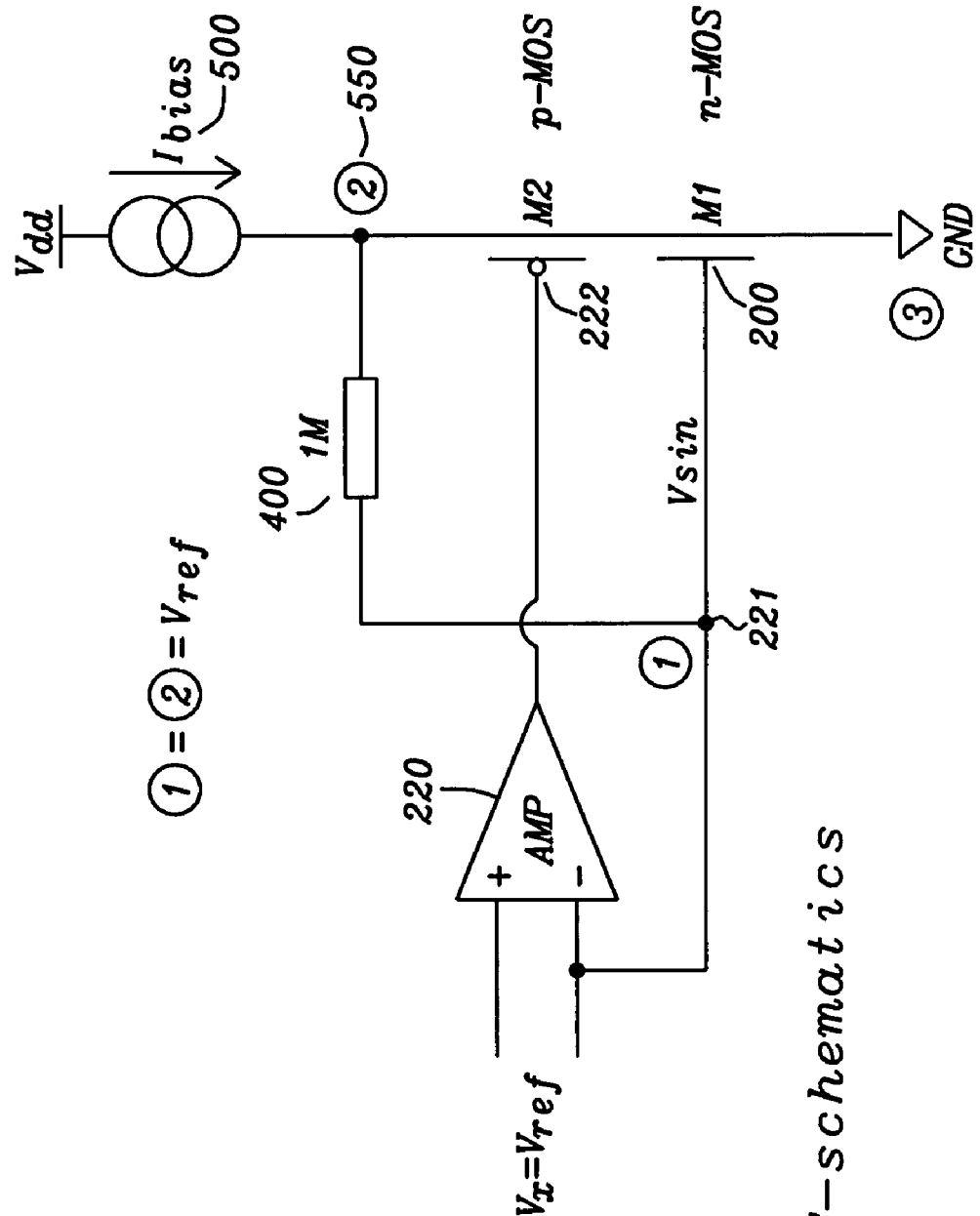
FIGS. 2B and 3B show equivalent DC-schematics of the relevant electrical circuit diagram parts of FIGS. 2A and 3A for said several different preferred embodiments of the present invention.
Figure 3A:
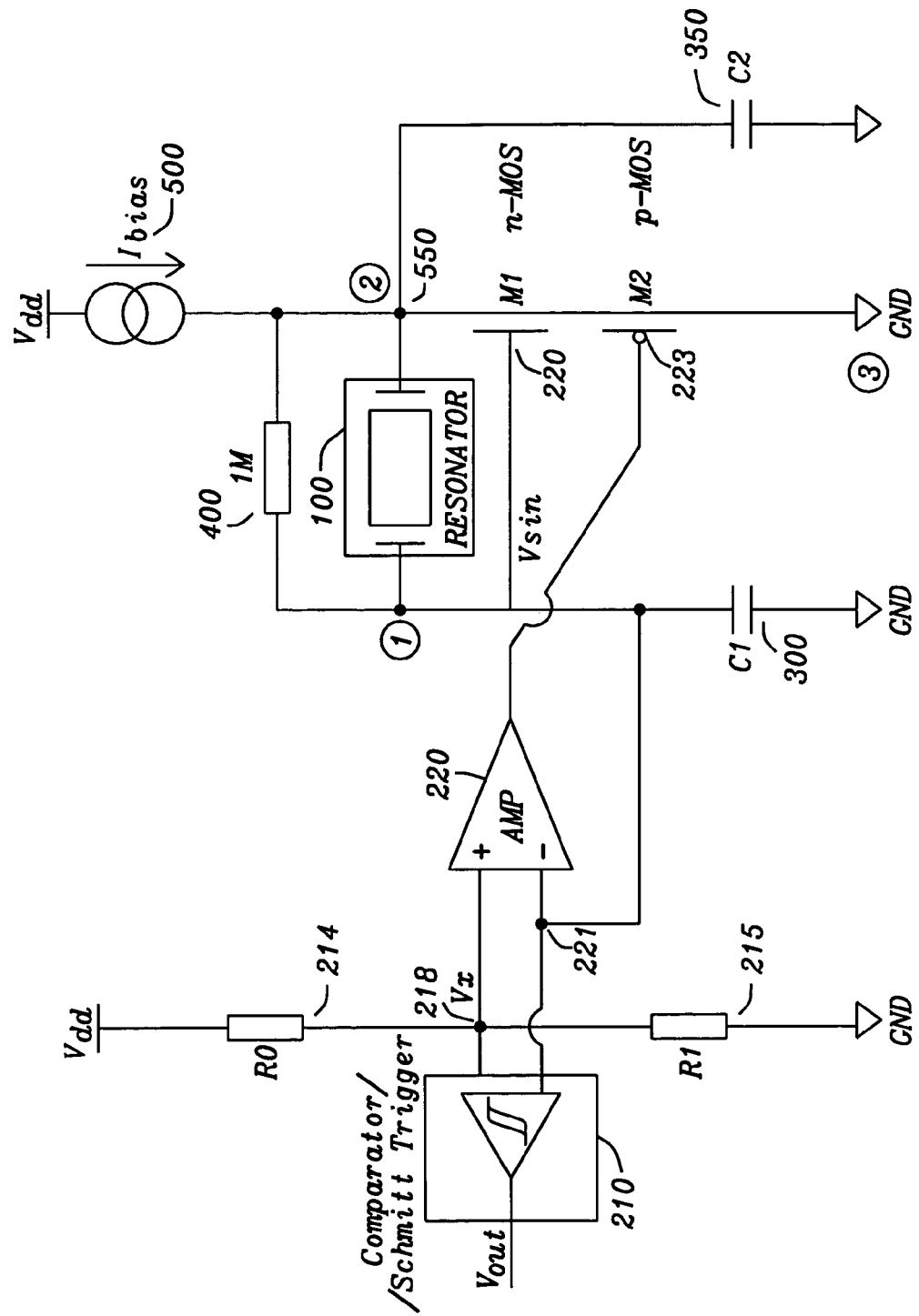

Restudying now FIG. 3A in comparison to FIG. 2A, another circuit diagram of the new oscillator circuit with an Average Controlled (AC) Resonator Driver is given in form of circuit schematics for a second embodiment. The essential components from the basic three-point oscillator circuit as shown in FIG. 1A prior art are the same as described by FIG. 2A, i.e. between the supply voltage $V_{dd}$ and ground (GND) a current source 500, named also as active supply component, delivering the bias-current $I_{bias}$ leads to a central connection point 550, node 2, from there FET M1 (item 200) is connected in series with said newly introduced FET M2 (item 223). This additional FET M2 (item 223) is named also as Average Controlling (AC) component and enhancing the prior art circuit to said new AC Resonator Driver oscillator circuit. Thus, the order of the series connection of the FETs in FIG. 2B is interchanged compared to FIG. 2A, i.e. said Average Controlling (AC) component FET M2 (item 223) on its part serially connected to said FET M1 (item 200) is now wired to ground node 3 with voltage GND. And said FET M1 (item 200) is now connected directly to node 2. The remaining connections and functions of the components of the circuit are again the same as described and explained with the help of FIG. 2A.

Figure 3B:
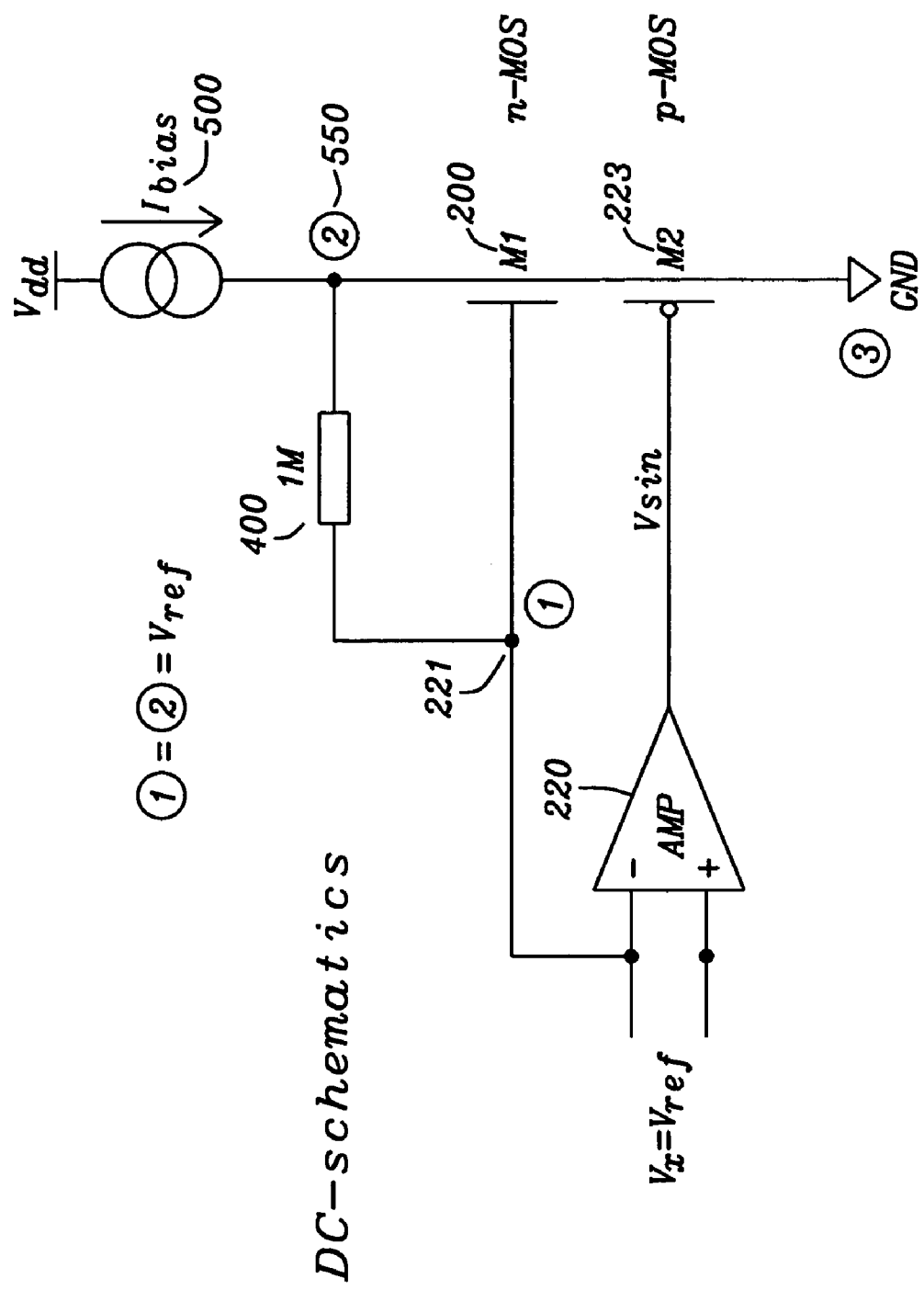

Considering now FIGS. 2B and 3B showing the equivalent DC-schematics of the relevant electrical circuit diagram parts of FIGS. 2A and 3A for said different preferred embodiments we find in each case—noting that the resonator has to be understood as an open circuit and thus here left out in the drawings—the voltage levels at node 1 (item 221) and at node 2 (item 550) being clamped to $V_x=V_{ref}$ by virtue of the nearly infinite open loop gain of the amplifier (item 220).

Looking now at FIG. 4, which depicts the waveforms of the internally generated sinus wave signal $V_{sin}$ of the Average Controlled (AC) Resonator Driver oscillator and the square wave of the precision Schmitt Trigger or a comparator device (item 210) output $V_{out}$ used for clocking purposes. The sine wave $V_{sin}$ is shown together with its moving voltage average value $V_{mean}$ (average), which has to have as prerequisite for being accurate an averaging device with sufficiently fast averaging behavior and with excellent short term averaging capabilities. This taken as granted it is made clear, that triggering at the points of intersection of $V_{sin}$ and $V_{mean}$ (average) for the square wave signal $V_{out}$ in order to change the polarity i.e. generating its leading and trailing edges of the square wave impulses results in a precise equity of the impulse durations, that is a duty-cycle of always exactly 50% for the square wave clock pulse $V_{out}$ is reached, because the zero crossings of the sine wave are met exactly to the mathematical properties of the sine wave, exhibiting an equidistant distribution of zero crossings, inter alia. The limiting factor in terms of frequency for this design is however the speed of the amplifier AMP (item 220) or in other words, its bandwidth. Furtheron the precision of the matching of the average $V_{mean}$ of the sinus wave signal $V_{sin}$ to said comparator reference voltage $V_x$ is depending on the open-loop gain of the amplifier AMP, it is approaching zero only for infinite gain. A sufficiently high gain-bandwidth product for the amplifier AMP is therefore favorable. The steepness of the square wave edges however depends solely on the dynamic specifications for the Schmitt Trigger or comparator (item 210) device. For all these reasons this design is an ideal case for slow oscillators with very strict duty-cycle requirements for clock pulses.

Regarding the flow diagram given in FIGS. 5 A, B, and C as well as FIGS. 6A, B, and C, the methods, explaining the construction and operation of the novel Average Controlled (AC) Resonator Driver oscillator circuits according to the invention and exemplified with the circuit diagrams of FIGS. 2A and 3A are now described and its steps—which are identical for every method in their first five steps—defined, wherein the first step 701 provides an oscillation generating circuit for an implementation of an Average Controlled (AC) Resonator Driver oscillator circuit in form of a basic three-point oscillator configuration, having three nodes (1, 2 and 3) and containing a resonator two-pole located between said first node 1 and said second node 2 as well as further passive and active components. Step 702 provides a terminal for supply voltage connection as well as a terminal for ground connection, which is tied to said third node 3, step 703 provides said passive components for said basic three-point oscillator circuit in form of two capacitors and one resistor embedding said resonator two-pole between said two capacitors, all arranged in PI-configuration, bridging said resonator with said resistor and in such a way, that capacitor one is tied with its first pole to said first node 1 and capacitor two, also with its first pole, tied to said second node 2, and step 704 provides further as passive components two resistors connected in series, forming a resistive voltage divider and tied on one divider side to said supply voltage terminal and on the other divider side to said ground terminal, establishing an intermediate node for a reference voltage. Step 705 provides as active components an operational amplifier with differential inputs, inverting and non-inverting and amplifier output as well as a Schmitt Trigger or a comparator circuit with signal input and reference input and circuit output and also a supply current source feeding into said second node 2.

The now following step of the methods varies for each of the different embodiments as described with the help of FIGS. 2A,B and 3A,B and will be named accordingly in the different methods, as steps 706 and 707 respectively.

Figure 5B:
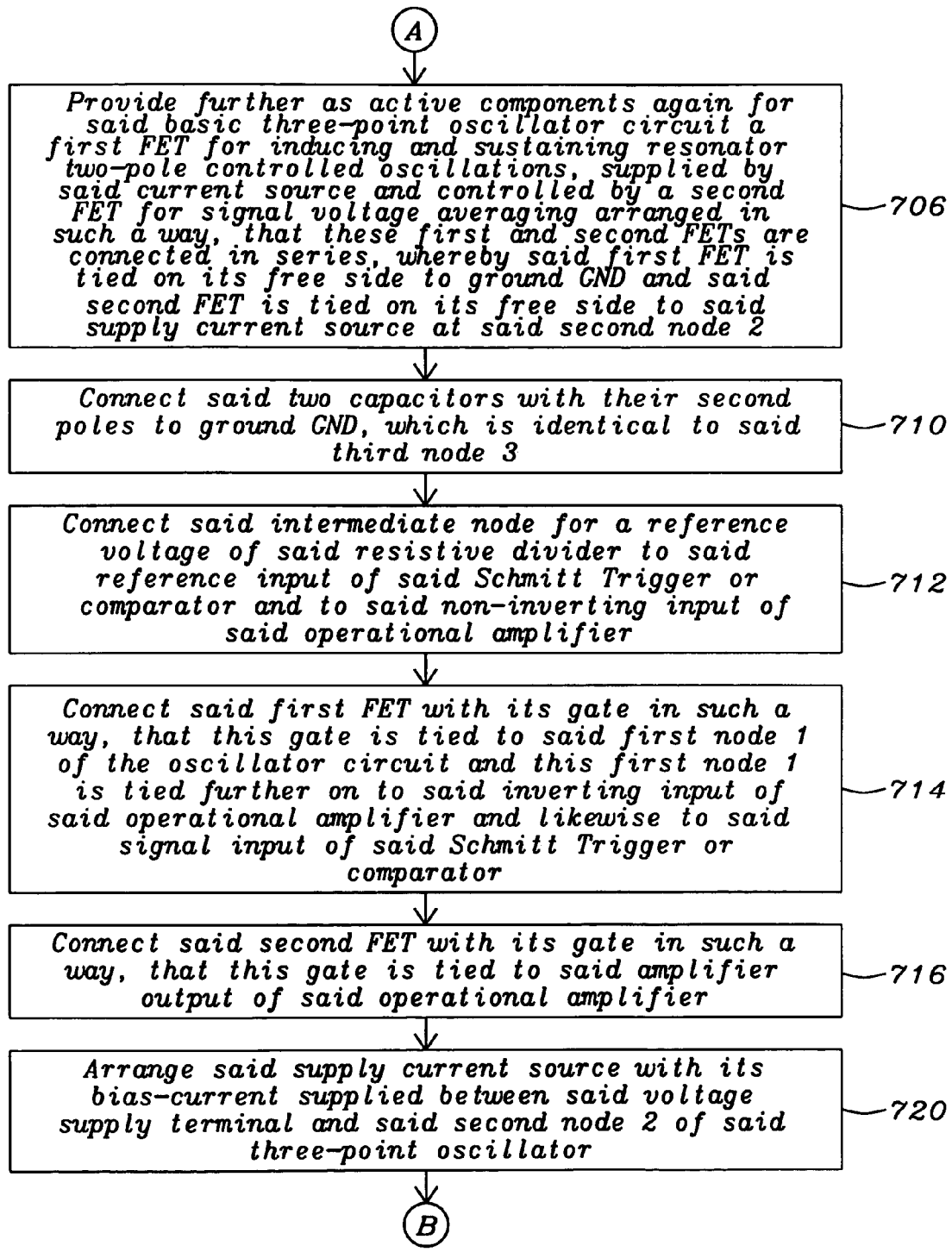
FIGS. 5 A, B, and C as well as FIGS. 6A, B, and C describe with the help of a flow diagram the according method for constructing and operating said different implementations for AC Resonator Driver circuits as shown in FIGS. 2A,B and 3A,B.

Step 706 belonging to the circuit of FIGS. 2A,B with method steps in FIG. 5B provides further as active components again for said basic three-point oscillator circuit a first FET for inducing and sustaining resonator two-pole controlled oscillations, supplied by said current source and controlled by a second FET for signal voltage averaging arranged in such a way, that these first and second FETs are connected in series, whereby said first FET is tied on its free side to ground and said second FET is tied on its free side to said supply current source at said second node 2.

Figure 6B:
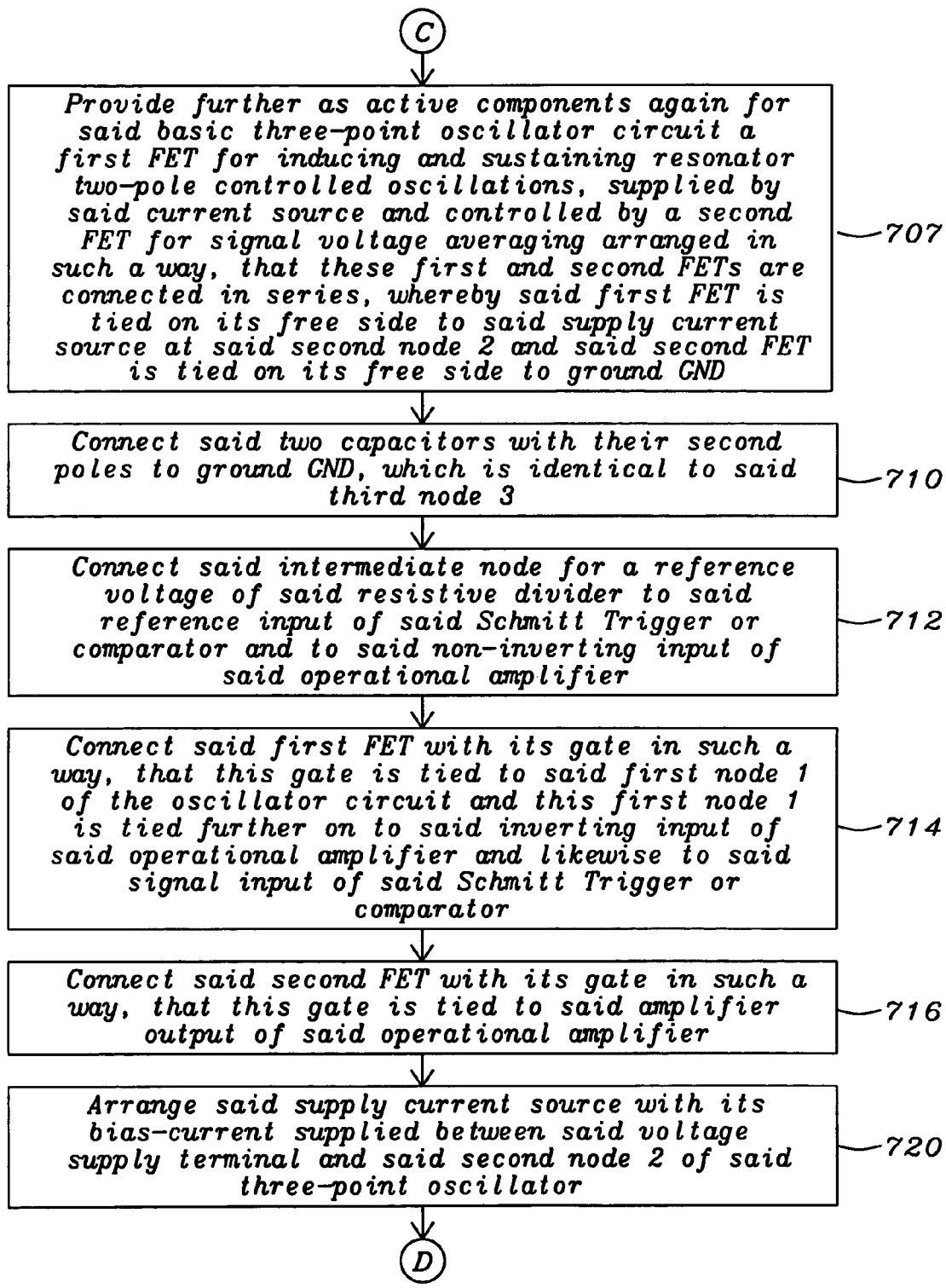

Step 707 belonging to the circuit of FIGS. 3A,B with method steps in FIG. 6B provides further as active components again for said basic three-point oscillator circuit a first FET for inducing and sustaining resonator two-pole controlled oscillations, supplied by said current source and controlled by a second FET for signal voltage averaging arranged in such a way, that these first and second FETs are connected in series, whereby said first FET is tied on its free side to said supply current source at said second node 2 and said second FET is tied on its free side to ground GND.

From now on, all method steps are identical again for all the methods given. Step 710 then connects said two capacitors with their second poles to ground GND, which is identical to said third node 3, step 712 connects said intermediate node for a reference voltage of said resistive divider to said reference input of said Schmitt Trigger or comparator device and to said non-inverting input of said operational amplifier, and steps 714 and 716 connect said first FET with its gate in such a way, that this gate is tied to said first node 1 of the oscillator circuit and this first node 1 is tied further on to said inverting input of said operational amplifier and likewise to said signal input of said Schmitt Trigger or comparator as well as said second FET with its gate in such a way, that this gate is tied to said amplifier output of said operational amplifier. Step 720 arranges said supply current source with its bias-current supplied between said voltage supply terminal and said second node 2 of said three-point oscillator. With step 730 said AC Resonator Driver oscillator circuit is operated as a basic three-point oscillator with said first FET as oscillation inducing and sustaining active component for signal amplifying additionally enhanced with said second FET for oscillation signal voltage averaging controlled by said amplifier output signal from said operational amplifier. Step 735 controls said averaging operation within said AC Resonator Driver oscillator circuit by regulating said oscillation signal voltage at said first node 1 of said three-point oscillator against said reference voltage at said intermediate node of said resistive voltage divider in such a way, that the difference of these voltages applied to said differential inputs of said operational amplifier generates an amplifier output signal fed to said second FET for oscillation signal voltage averaging is kept as small as possible, thus effectively stabilizing the voltage average of said oscillator signal to said reference voltage. Step 740 starts generating continuous oscillations, consisting of alternating half-waves of oscillation cycles by operating said AC Resonator Driver oscillator circuit with said resonator-current flowing through said resonator element fed in by said supply current source and also through said oscillation inducing and sustaining first FET as well as through said second FET for oscillation signal voltage averaging, controlled by said averaging operation. Finally step 750 generates a square wave output signal with a precise duty-cycle of 50% out of said alternating half-waves of oscillation cycles of said oscillation signal voltage by feeding said Schmitt Trigger or comparator with said oscillation signal voltage and therein comparing against said reference voltage at said intermediate node of said resistive voltage divider thus delivering square wave pulses with alternating polarity exactly synchronized with said alternating half-waves of oscillation cycles of said voltage averaged oscillation signal.

Figure 7A:
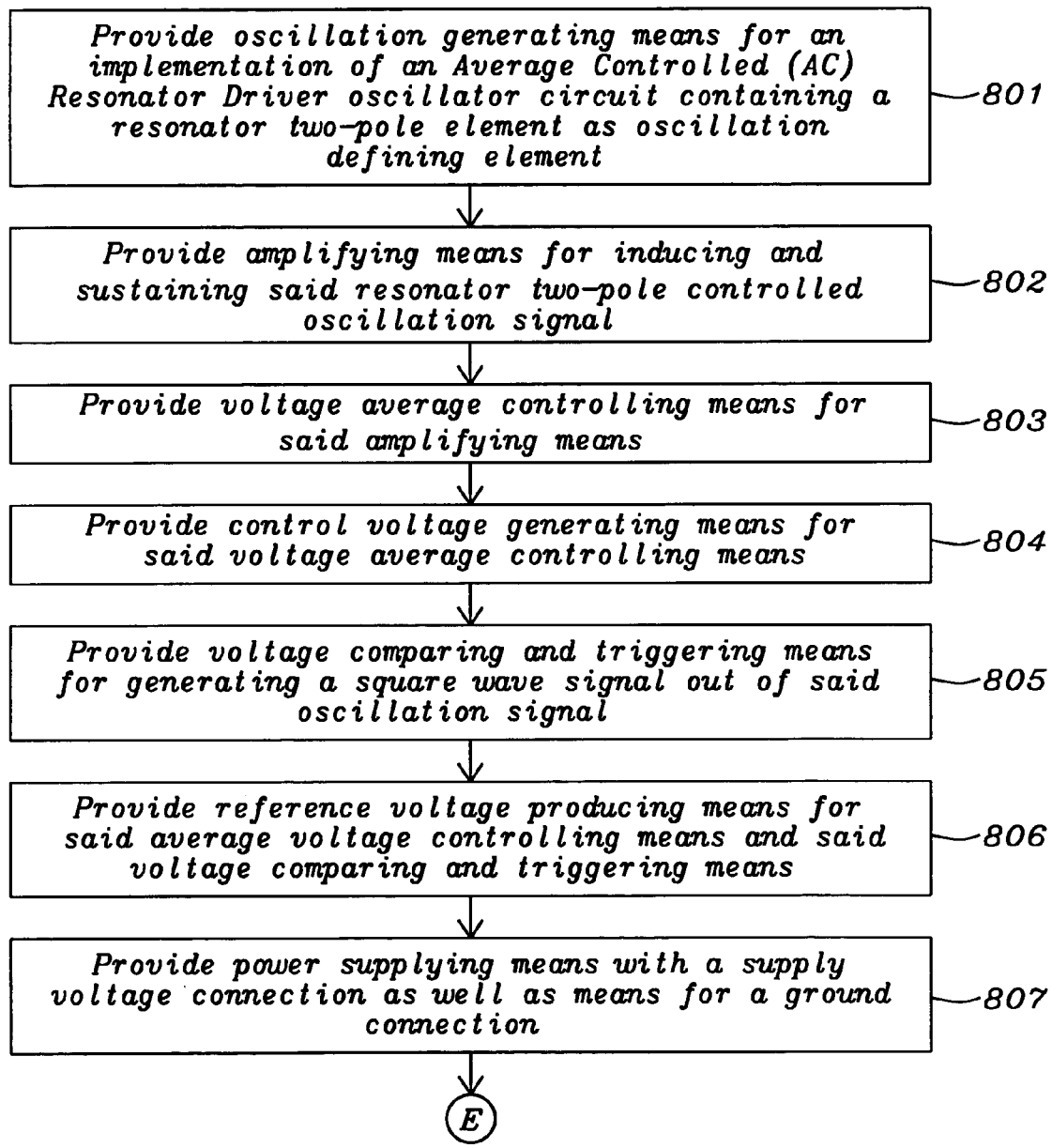
FIGS. 7A–7C explain with the help of another flow diagram a more general method for constructing and operating an AC Resonator Driver circuit.
Figure 7B:
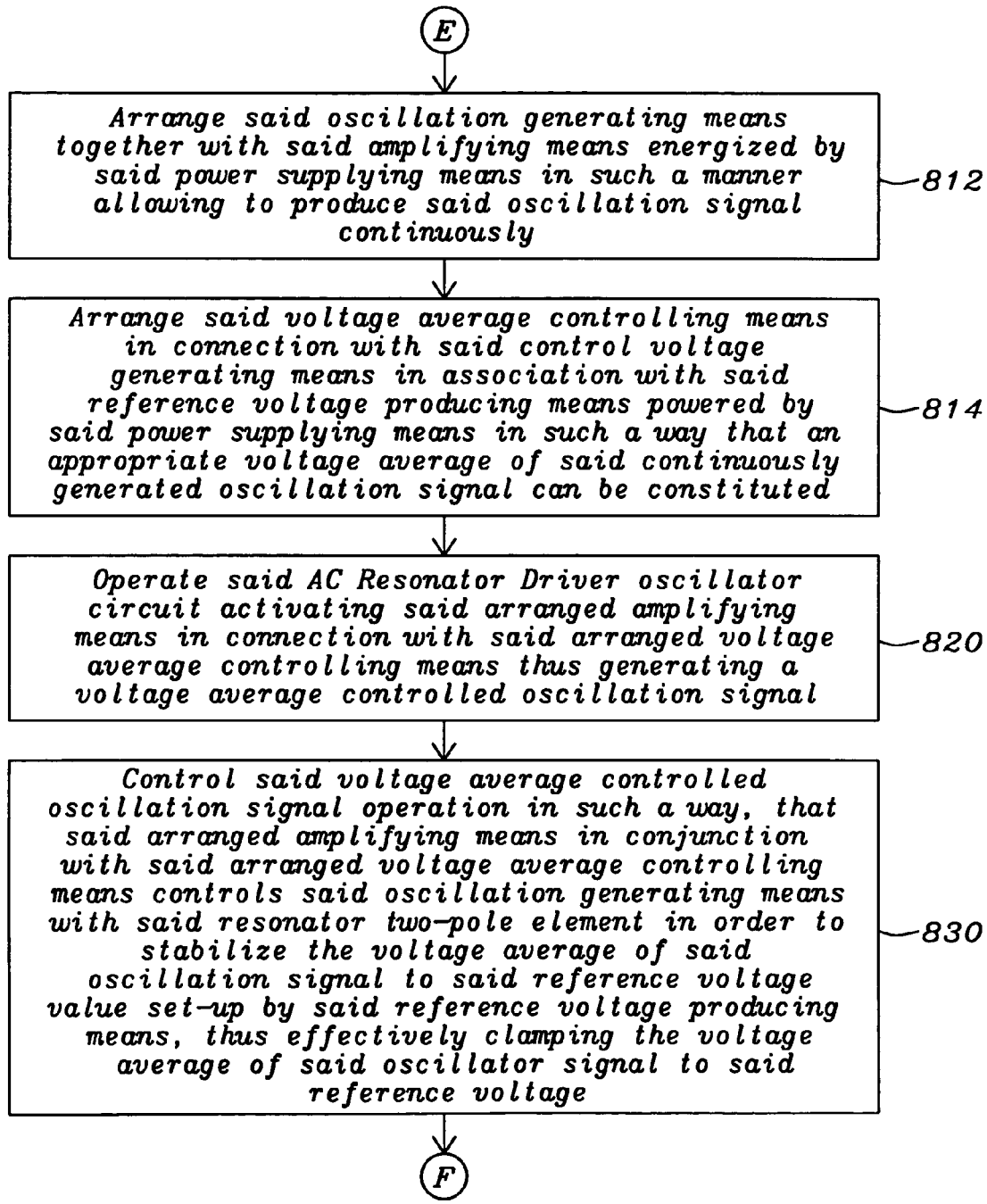
Figure 7C:
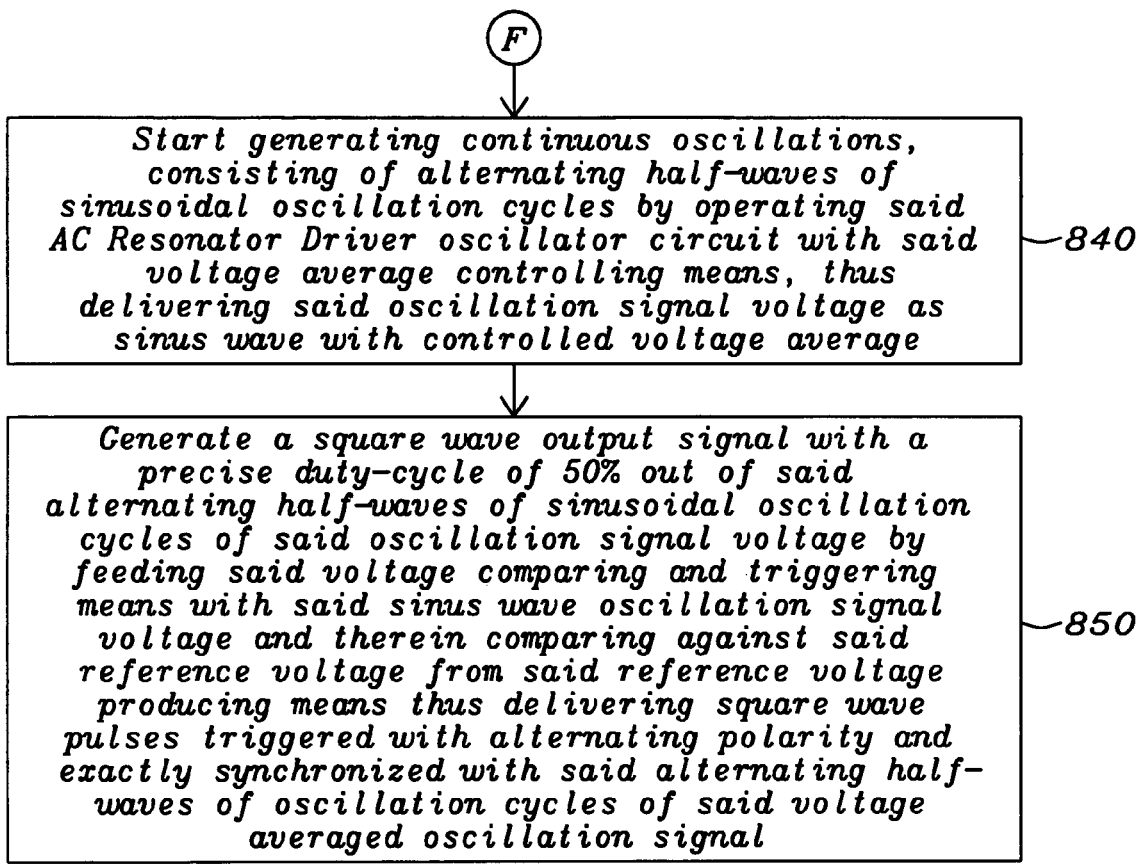

Regarding now the flow diagram given in FIGS. 7A–7C, a much more general method, explaining the construction and operation of a novel Avarage Controlled (AC) Resonator Driver oscillator circuit according to the invention is now described and defined by its steps, wherein as first step 801 oscillation generating means for an implementation of an Average Controlled (AC) Resonator Driver oscillator circuit containing a resonator two-pole element as oscillation defining element is provided. Step 802 provides amplifying means for inducing and sustaining said resonator two-pole controlled oscillation signal, step 803 provides voltage average controlling means for said amplifying means, step 804 provides control voltage generating means for said voltage average controlling means. Step 805 provides voltage comparing and triggering means for generating a square wave signal out of said oscillation signal. Steps 806 and 807 provide reference voltage producing means for said average voltage controlling means and said voltage comparing and triggering means together with power supplying means with a supply voltage connection as well as means for a ground connection. Steps 812 and 814 arrange said oscillation generating means together with said amplifying means energized by said power supplying means in such a manner allowing to produce said oscillation signal continuously and also arrange said voltage average controlling means in connection with said control voltage generating means in association with said reference voltage producing means powered by said power supplying means in such a way that an appropriate voltage average of said continuously generated oscillation signal can be constituted. Within step 820 said AC Resonator Driver oscillator circuit is operated activating said arranged amplifying means in connection with said arranged voltage average controlling means thus generating a voltage average controlled oscillation signal. Step 830 controls said voltage average controlled oscillation signal operation in such a way, that said arranged amplifying means in conjunction with said arranged voltage average controlling means controls said oscillation generating means with said resonator two-pole element in order to stabilize the voltage average of said oscillation signal to said reference voltage value set-up by said reference voltage producing means, thus effectively clamping the voltage average of said oscillator signal to said reference voltage. Step 840 starts generating continuous oscillations, consisting of alternating half-waves of sinusoidal oscillation cycles by operating said AC Resonator Driver oscillator circuit with said voltage average controlling means, thus delivering said oscillation signal voltage as sinus wave with controlled voltage average. And finally step 850 generates a square wave output signal with a precise duty-cycle of 50% out of said alternating half-waves of sinusoidal oscillation cycles of said oscillation signal voltage by feeding said voltage comparing and triggering means with said sinus wave oscillation signal voltage and therein comparing against said reference voltage from said reference voltage producing means thus delivering square wave pulses triggered with alternating polarity and exactly synchronized with said alternating half-waves of oscillation cycles of said voltage averaged oscillation signal.

Summarizing the essential operational features of the circuit we find, while various circuit implementations are given for the invention of an Average Controlled (AC) resonator driver they all fulfill the intended object of generating an average voltage value stabilized sinusoidal oscillation signal by controlling the crystal oscillator's amplifier element. This signal is then transformed into a square wave with a precise duty-cycle of exactly 50%.

As shown in the preferred embodiments and evaluated by circuit analysis, the novel system, circuits and methods provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A circuit, realizing an oscillator circuit with an Average Controlled (AC) Resonator Driver and producing a square wave clock signal with a precise duty-cycle of exactly 50%, comprising:

an oscillation signal generating circuit in form of a basic three-point oscillator configuration, having three nodes (1, 2 and 3) and containing a resonator element located between said first node 1 and said second node 2;

a terminal pin for supply voltage connection;

a terminal pin for ground connection, which is tied to said third node 3;

two capacitors and one resistor as passive components, whereby said passive components are embedding said resonator element between said two capacitors, all components arranged in PI-configuration, bridging said resonator with said resistor and arranged in such a way, that capacitor one is tied with its first pole to said first node 1 and capacitor two, also with its first pole, is tied to said second node 2;

a current source as active supply component connected to said supply voltage and arranged in such a way, that said active supply component supplying a bias-current is located between said voltage supply terminal and said second node 2;

a first Field Effect Transistor (FET) as basic active component for inducing and sustaining resonator two-pole controlled sinusoidal oscillations;

a second FET for stabilizing the voltage average of said sinusoidal oscillation signal as auxiliary active component;

a resistive voltage divider made up of two resistors, delivering at its intermediate connection node a reference voltage;

a differential operational amplifier with inverting and non-inverting inputs for said voltage average control, its inverting input connected to said first node 1 and its non-inverting input connected to said intermediate connection node of said resistive voltage divider whereas the amplifier output is being tied to the gate of said second FET as auxiliary active component, thus controlling said voltage average stabilization operation; and a Schmitt Trigger or comparator device with signal and reference inputs, its reference input connected to said intermediate connection node of said resistive voltage divider and its signal input connected to said first node 1 and delivering a square wave clock signal on its output, whereby said comparison of said voltage average stabilized sinus wave oscillation signal with said reference voltage also used for averaging results in an exact determination of sinus wave zero crossings, triggering a polarity change of said square wave clock signal and thus effectively stabilizing said square wave clock signal generation especially with regard to precision and stability of its 50% duty-cycle.

2. The circuit according to claim 1 wherein the channels of said two FETs are connected in series and said first FET is on its free side of its channel being connected to ground or said node 3.

3. The circuit according to claim 2 wherein said second FET is on its free side of its channel being connected to said second node 2.

4. The circuit according to claim 1 wherein the channels of said two FETs are connected in series and said first FET is on its free side of its channel being connected to said second node 2.

5. The circuit according to claim 4 wherein said second FET is on its free side of its channel being connected to ground or said second node 3.

6. The circuit according to claim 1 wherein said resonator element is a crystal resonator element that produces an oscillating signal having a predetermined oscillation frequency.

7. The circuit according to claim 6 wherein said crystal resonator element is a Quartz crystal.

8. The circuit according to claim 6 wherein said crystal resonator element is a Piezo crystal.

9. The circuit according to claim 1 wherein said resonator element is a a resonator element fabricated using TFR technologies.

10. The circuit according to claim 1 wherein said resonator element is a serial connection of an inductor, a capacitor and a resistor.

11. The circuit according to claim 1 wherein said resonator element is a parallel connection of an inductor, a capacitor and a resistor.

12. The circuit according to claim 1 wherein said resonator element is a resonator circuit fabricated using MEMS technologies.

13. The circuit according to claim 1 wherein said first FET is of the n-MOS type and said second FET is of the p-MOS type.

14. The circuit according to claim 1 wherein said first FET is of the p-MOS type said second FET is of the n-MOS type.

15. The circuit according to claim 1 manufactured using modern integrated circuit technologies.

16. The circuit according to claim 15 manufactured as a monolithic integrated circuit.

17. The circuit according to claim 15 manufactured as integrated circuit in monolithic CMOS technology.

18. A circuit, realizing an oscillator circuit with an Average Controlled (AC) Resonator Driver and producing a square wave clock signal with a precise duty-cycle of exactly 50%, comprising:
   oscillation generating means containing a resonator two-pole element as oscillation defining element delivering a sinus wave oscillation signal;
   amplifying means for inducing and sustaining said resonator two-pole controlled oscillations;
   power supplying means with supply voltage connection;
   means for a ground connection;
   voltage average controlling means for said amplifying means forming a voltage average controlled sinus wave oscillation signal;
   control voltage generating means for said voltage average controlling means;
   reference voltage producing means for said average voltage controlling means and said voltage comparing and triggering means;
   power supplying means with a supply voltage connection as well as means for a ground connection; and
   voltage comparing and triggering means for generating a square wave clock signal out of said voltage average controlled sinus wave oscillation signal arranged in such a way, that said voltage comparing and triggering means generates a square wave output signal with a precise duty-cycle of 50% out of said alternating half-waves of sinusoidal oscillation cycles of said sinus wave oscillation signal voltage by feeding said voltage comparing and triggering means with said sinus wave oscillation signal voltage and therein comparing against said reference voltage from said reference voltage producing means thus delivering square wave pulses triggered with alternating polarity and exactly synchronized with said alternating half-waves of sinus wave oscillation cycles of said voltage averaged sinus wave oscillation signal.

19. The circuit according to claim 18 wherein said oscillation generating means is implemented as a three-point oscillator circuit.

20. The circuit according to claim 18 wherein said amplifying means is implemented as a Field Effect Transistor (FET).

21. The circuit according to claim 20 wherein said FET is of the n-MOS type.

22. The circuit according to claim 20 wherein said FET is of the p-MOS type.

23. The circuit according to claim 18 wherein said power supplying means is implemented as a current source.

24. The circuit according to claim 18 wherein said current controlling means is implemented as a controlled current source.

25. The circuit according to claim 18 wherein said means for a ground connection means is a ground terminal.

26. The circuit according to claim 18 wherein said resonator two-pole element is a crystal resonator element that produces an oscillating signal having a predetermined oscillation frequency.

27. The circuit according to claim 26 wherein said crystal resonator element is a Quartz crystal.

28. The circuit according to claim 26 wherein said crystal resonator element is a Piezo crystal.

29. The circuit according to claim 18 wherein said resonator two-pole element is a a resonator element fabricated using TFR technologies.

30. The circuit according to claim 18 wherein said resonator two-pole element is a serial connection of an inductor, a capacitor and a resistor.

31. The circuit according to claim 18 wherein said resonator two-pole element is a parallel connection of an inductor, a capacitor and a resistor.

32. The circuit according to claim 18 wherein said resonator two-pole element is a resonator circuit fabricated using MEMS technologies.

33. The circuit according to claim 18 manufactured using modern integrated circuit technologies.

34. The circuit according to claim 33 manufactured as a monolithic integrated circuit.

35. The circuit according to claim 33 manufactured as integrated circuit in monolithic CMOS technology.

36. A method for an oscillation generating circuit implemented as an Average Controlled (AC) Resonator Driver oscillator circuit producing a square wave clock signal with a precise duty-cycle of exactly 50%, comprising:
   providing an oscillation generating circuit for an implementation of an Average Controlled (AC) Resonator Driver oscillator circuit in form of a basic three-point oscillator configuration, having three nodes (1, 2 and 3) and containing a resonator two-pole located between said first node 1 and said second node 2 as well as further passive and active components;
   providing a terminal for supply voltage connection as well as a terminal for ground connection, which is tied to said third node 3;
   providing said passive components for said basic three-point oscillator circuit in form of two capacitors and one resistor embedding said resonator two-pole between said two capacitors, all arranged in PI-configuration, bridging said resonator with said resistor and in such a way, that capacitor one is tied with its first pole to said first node 1 and capacitor two, also with its first pole, tied to said second node 2;
   providing further as passive components two resistors connected in series, forming a resistive voltage divider and tied on one divider side to said supply voltage terminal and on the other divider side to said ground terminal, establishing an intermediate node for a reference voltage;

providing as active components an operational amplifier with differential inputs, inverting and non-inverting and amplifier output as well as a Schmitt Trigger or comparator with signal input and reference input and comparator output and also a supply current source feeding into said second node 2;

providing further as active components again for said basic three-point oscillator circuit a first FET for inducing and sustaining resonator two-pole controlled oscillations, supplied by said current source and controlled by a second FET for signal voltage averaging arranged in such a way, that these first and second FETs are connected in series, whereby said first FET is tied on its free side to ground GND or said node 3 and said second FET is tied on its free side to said supply current source at said second node 2;

connecting said two capacitors with their second poles to ground GND, which is identical to said third node 3;

connecting said intermediate node for a reference voltage of said resistive divider to said reference input of said Schmitt Trigger or comparator and to said non-inverting input of said operational amplifier;

connecting said first FET with its gate in such a way, that this gate is tied to said first node 1 of the oscillator circuit and this first node 1 is tied further on to said inverting input of said operational amplifier and likewise to said signal input of said Schmitt Trigger or comparator;

connecting said second FET with its gate in such a way, that this gate is tied to said amplifier output of said operational amplifier arranging said supply current source with its bias-current supplied between said voltage supply terminal and said second node 2 of said three-point oscillator;

operating said AC Resonator Driver oscillator circuit as a basic three-point oscillator with said first FET as oscillation inducing and sustaining active component for signal amplifying additionally enhanced with said second FET for oscillation signal voltage averaging controlled by said amplifier output signal from said operational amplifier;

controlling said averaging operation within said AC Resonator Driver oscillator circuit by regulating said oscillation signal voltage at said first node 1 of said three-point oscillator against said reference voltage at said intermediate node of said resistive voltage divider in such a way, that the difference of these voltages applied to said differential inputs of said operational amplifier generates an amplifier output signal fed to said second FET for oscillation signal voltage averaging is kept as small as possible, thus effectively stabilizing the voltage average of said oscillator signal to said reference voltage;

starting the generation of continuous oscillations, consisting of alternating half-waves of oscillation cycles by operating said AC Resonator Driver oscillator circuit with said resonator-current flowing through said resonator element fed in by said supply current source and also through said oscillation inducing and sustaining first FET as well as through said second FET for oscillation signal voltage averaging, controlled by said averaging operation; and generating a square wave output signal with a precise duty-cycle of 50% out of said alternating half-waves of oscillation cycles of said oscillation signal voltage by feeding said Schmitt Trigger or comparator with said oscillation signal voltage and therein comparing against said reference voltage at said intermediate node of said resistive voltage divider thus delivering square wave pulses with alternating polarity exactly synchronized with said alternating half-waves of oscillation cycles of said voltage averaged oscillation signal.

37. A method for an oscillation generating circuit implemented as an Average Controlled (AC) Resonator Driver oscillator circuit producing a square wave clock signal with a precise duty-cycle of exactly 50%, comprising:

providing an oscillation generating circuit for an implementation of an Average Controlled (AC) Resonator Driver oscillator circuit in form of a basic three-point oscillator configuration, having three nodes (1, 2 and 3) and containing a resonator two-pole located between said first node 1 and said second node 2 as well as further passive and active components;

providing a terminal for supply voltage connection as well as a terminal for ground connection, which is tied to said third node 3;

providing said passive components for said basic three-point oscillator circuit in form of two capacitors and one resistor embedding said resonator two-pole between said two capacitors, all arranged in PI-configuration, bridging said resonator with said resistor and in such a way, that capacitor one is tied with its first pole to said first node 1 and capacitor two, also with its first pole, tied to said second node 2;

providing further as passive components two resistors connected in series, forming a resistive voltage divider and tied on one divider side to said supply voltage terminal and on the other divider side to said ground terminal, establishing an intermediate node for a reference voltage;

providing as active components an operational amplifier with differential inputs, inverting and non-inverting and amplifier output as well as a Schmitt Trigger or comparator with signal input and reference input and comparator output and also a supply current source feeding into said second node 2;

providing further as active components again for said basic three-point oscillator circuit a first FET for inducing and sustaining resonator two-pole controlled oscillations, supplied by said current source and controlled by a second FET for signal voltage averaging arranged in such a way, that these first and second FETs are connected in series, whereby said first FET is tied on its free side to said supply current source at said second node 2 and said second FET is tied on its free side to ground GND or said node 3;

connecting said two capacitors with their second poles to ground GND, which is identical to said third node 3;

connecting said intermediate node for a reference voltage of said resistive divider to said reference input of said Schmitt Trigger or comparator and to said non-inverting input of said operational amplifier;

connecting said first FET with its gate in such a way, that this gate is tied to said first node 1 of the oscillator circuit and this first node 1 is tied further on to said inverting input of said operational amplifier and likewise to said signal input of said Schmitt Trigger or comparator;

connecting said second FET with its gate in such a way, that this gate is tied to said amplifier output of said operational amplifier arranging said supply current source with its bias-current supplied between said voltage supply terminal and said second node 2 of said three-point oscillator;

operating said AC Resonator Driver oscillator circuit as a basic three-point oscillator with said first FET as oscillation inducing and sustaining active component for signal amplifying additionally enhanced with said second FET for oscillation signal voltage averaging controlled by said amplifier output signal from said operational amplifier;

controlling said averaging operation within said AC Resonator Driver oscillator circuit by regulating said oscillation signal voltage at said first node 1 of said three-point oscillator against said reference voltage at said intermediate node of said resistive voltage divider in such a way, that the difference of these voltages applied to said differential inputs of said operational amplifier generates an amplifier output signal fed to said second FET for oscillation signal voltage averaging is kept as small as possible, thus effectively stabilizing the voltage average of said oscillator signal to said reference voltage;

starting the generation of continuous oscillations, consisting of alternating half-waves of oscillation cycles by operating said AC Resonator Driver oscillator circuit with said resonator-current flowing through said resonator element fed in by said supply current source and also through said oscillation inducing and sustaining first FET as well as through said second FET for oscillation signal voltage averaging, controlled by said averaging operation; and generating a square wave output signal with a precise duty-cycle of 50% out of said alternating half-waves of oscillation cycles of said oscillation signal voltage by feeding said Schmitt Trigger or comparator with said oscillation signal voltage and therein comparing against said reference voltage at said intermediate node of said resistive voltage divider thus delivering square wave pulses with alternating polarity exactly synchronized with said alternating half-waves of oscillation cycles of said voltage averaged oscillation signal.

38. A method for an oscillation generating circuit implemented as an Average Controlled (AC) Resonator Driver oscillator circuit producing a square wave clock signal with a precise duty-cycle of exactly 50%, comprising:

providing oscillation generating means for an implementation of an Average Controlled (AC) Resonator Driver oscillator circuit containing a resonator two-pole element as oscillation defining element;

providing amplifying means for inducing and sustaining said resonator two-pole controlled oscillation signal;

providing voltage average controlling means for said amplifying means;

providing control voltage generating means for said voltage average controlling means;

providing voltage comparing and triggering means for generating a square wave signal out of said oscillation signal;

providing reference voltage producing means for said average voltage controlling means and said voltage comparing and triggering means;

providing power supplying means with a supply voltage connection as well as means for a ground connection;

arranging said oscillation generating means together with said amplifying means energized by said power supplying means in such a manner allowing to produce said oscillation signal continuously;

arranging said voltage average controlling means in connection with said control voltage generating means in association with said reference voltage producing means powered by said power supplying means in such a way that an appropriate voltage average of said continuously generated oscillation signal can be constituted;

operating said AC Resonator Driver oscillator circuit activating said arranged amplifying means in connection with said arranged voltage average controlling means thus generating a voltage average controlled oscillation signal;

controlling said voltage average controlled oscillation signal operation in such a way, that said arranged amplifying means in conjunction with said arranged voltage average controlling means controls said oscillation generating means with said resonator two-pole element in order to stabilize the voltage average of said oscillation signal to said reference voltage value set-up by said reference voltage producing means, thus effectively clamping the voltage average of said oscillator signal to said reference voltage;

starting the generation of continuous oscillations, consisting of alternating half-waves of sinusoidal oscillation cycles by operating said AC Resonator Driver oscillator circuit with said voltage average controlling means, thus delivering said oscillation signal voltage as sinus wave with controlled voltage average; and generating a square wave output signal with a precise duty-cycle of 50% out of said alternating half-waves of sinusoidal oscillation cycles of said oscillation signal voltage by feeding said voltage comparing and triggering means with said sinus wave oscillation signal voltage and therein comparing against said reference voltage from said reference voltage producing means thus delivering square wave pulses triggered with alternating polarity and exactly synchronized with said alternating half-waves of oscillation cycles of said voltage averaged oscillation signal.

\* \* \* \* \*